United States Patent [19]

Ogata et al.

[11] Patent Number: 5,398,197
[45] Date of Patent: Mar. 14, 1995

[54] METHOD OF CREATING DEBUG SPECIFICATION AND TEST PROGRAM CREATING SPECIFICATION

[75] Inventors: Teruaki Ogata; Yuko Sudou, both of Itami, Japan

[73] Assignee: Mitsubishi Denki Kabushiki Kaisha, Tokyo, Japan

[21] Appl. No.: 881,290

[22] Filed: May 11, 1992

[30] Foreign Application Priority Data

Oct. 6, 1991 [JP] Japan .................................. 3-136908

[51] Int. Cl.⁶ ............................................ G05B 17/00
[52] U.S. Cl. .................... 364/580; 364/191; 364/578; 395/919; 395/922
[58] Field of Search ......................... 364/191–193, 364/481, 483, 484, 489, 578, 580; 371/19; 395/419, 922

[56] References Cited

U.S. PATENT DOCUMENTS

| | | | |
|---|---|---|---|
| 4,977,531 | 12/1990 | Ogata et al. | 364/580 |
| 5,020,009 | 5/1991 | Ogata et al. | 364/580 |
| 5,020,010 | 5/1991 | Ogata et al. | 364/580 |
| 5,038,296 | 8/1991 | Sano | 395/922 |
| 5,053,981 | 10/1991 | Ogata et al. | 364/580 |
| 5,084,813 | 1/1992 | Ono | 395/922 |
| 5,267,175 | 11/1993 | Hooper | 364/489 |

Primary Examiner—Emanuel T. Voeltz
Assistant Examiner—Hal D. Wachsman
Attorney, Agent, or Firm—Leydig, Voit & Mayer

[57] ABSTRACT

A method of creating a debug specification includes the steps of reading in either a measurement specification or a test program, extracting setting conditions for each measuring parameter from the read measurement specification or the test program, extracting terminals of a circuit to be measured required for debugging as checking terminals, extracting the setting conditions of the extracted checking terminals as checking conditions, determining whether the checking terminals and the checking conditions for each extracted measuring parameter are changed from the corresponding previous measuring parameter of the previous stage, extracting the changed checking terminals and the checking conditions as changing conditions when the checking terminals and the checking conditions have changed and extracting a changing timing at which the change takes place, and outputting all the changing conditions and the changing timings extracted for all the measuring parameters as a debug specification. A test program creating specification can be created in a similar manner.

4 Claims, 3 Drawing Sheets

METHOD OF CREATING DEBUG SPECIFICATION AND TEST PROGRAM CREATING SPECIFICATION

BACKGROUND OF THE INVENTION

1. Field of the Invention

The present invention relates to a method of creating a debug specification used in debugging an electronic circuit measuring apparatus and a test program specification used for creating a test program.

2. Description of the Related Art

FIG. 3 shows an ordinary electronic circuit measuring circuit. A circuit 4 to be measured, such as a semiconductor integrated circuit, is set in a measuring peripheral circuit 5. The electronic circuit measuring apparatus 1 has a plurality of power sources R1 to R4 which are connected through switches SW1 to SW4 provided in the peripheral circuit 5 to pins P1 to P4 of the circuit 4. The peripheral circuit 5 has a switch SWa between the pin P2 of the circuit 4 and a grounded terminal. The electronic circuit measuring apparatus 1 also has a peripheral circuit control unit 2 for controlling the switches SW1 to SW4 and SWa of the peripheral circuit 5, and a tester controller 3 programmed to control the peripheral circuit control unit 2 and the power sources R1 to R4. The peripheral circuit 5 is provided when the measuring specification cannot be implemented by the electronic circuit measuring apparatus 1 alone or when it is inconvenient to implement the measuring specification in terms of the measuring operation by the electronic circuit measuring apparatus 1 alone.

When the characteristics of the circuit 4 are determined using such a measuring apparatus, measurements are carried out on the basis of the measurement specification shown in, for example, Table 1.

these test programs, the peripheral circuit control unit 2 of the electronic circuit measuring apparatus 1 controls the switches SW1 to SW4 and SWa of the peripheral circuit 5, supplies electronic signals from the power sources R1 to R4 to the circuit 4, and measures output signals from the circuit 4 to determine the characteristics thereof.

Prior to the measurement, it is necessary to check whether the measuring conditions defined by the test program satisfy the measuring conditions indicated in the measurement specification, i.e., debugging must be performed. This debugging is conducted by checking the electrical state at the pins P1 to P4 of the circuit to be measured 4 using a waveform observing device, such as an oscilloscope, connected to the pins P1 to P4. Regarding, for example, the TEST1, i.e., the measurement of the leakage current 1, 0.4 v and 0 v are respectively applied to the pins P1 and P3 of the circuit to be measured 4 and the states of the switches SW1 and SW3 are checked. In the TEST2, i.e., in the measurement of the leakage current 2, the states of the switches SW2 and SW3 are checked. Debugging is conducted similarly regarding the other measuring parameters.

In the conventional debugging method, checking of the measuring conditions is thus conducted for each of the consecutive measuring parameters. Consequently, debugging requires time and is troublesome work.

Furthermore, there is the possibility that the power source or the like used in a previous stage is not disconnected and therefore measured in a measurement to be executed after the power source or the like used in a previous stage should have been disconnected.

SUMMARY OF THE INVENTION

An object of the present invention is to provide a method of creating a debug specification which enables an accurate debugging operation to be effectively performed.

TABLE 1

| Measuring parameter | | Measuring condition | Standard value | | Setting condition | | | | | | | | |
|---|---|---|---|---|---|---|---|---|---|---|---|---|---|
| No. | Name of parameter | | Minumum | Maximum | P1 | P2 | P3 | P4 | SW1 | SW2 | SW3 | SW4 | SWa |
| 1 | Leak current 1 | VF = 0.4 V, IM | 1 μA | 3 μA | M | | 0V | | on | | on | | |
| 2 | Leak current 2 | VF = 0.4 V, IM | 2 μA | 4 μA | | M | 0V | | | on | on | | |
| 3 | Circuit current | VF = 5 V, IM | 10 mA | 20 mA | | | 0V | M | | | on | on | on |
| 4 | Terminal voltage 1 | IF = 0 μA, VM | 1 V | 2 V | M | | 0V | 5V | on | | on | on | on |
| 5 | Terminal voltage 2 | IF = 0 μA, VM | 2 V | 3 V | | M | 0V | 5V | | on | on | on | on |

Alternatively, measurements are carried out on the basis of the test program obtained by converting the measurement specification shown in Table 1 to a computer program. For example, measurement of leakage currents 1 and 2 as the measurement Nos. 1 and 2 in Table 1 respectively correspond to the following test programs TEST1 and TEST2.

TEST 1: leakage current 1
 SET SW1=ON, SW3=ON
 SET PIN1=0.4 V, MEAS. MODE=I
 SET PIN3=0 V
 MEAS PIN 1
 JUDGE LO 1μA, HI 3μA
TEST 2: leakage current 2
 SET SW2=ON, SW1=OFF
 SET PIN1=OFF
 SET PIN2=0.4 V, MEAS. MODE=I
 MEAS PIN2
 JUDGE LO 2 μA, HI 4 μA These test programs contain a series of steps which can be carried out by the tester controller 3 of the electronic circuit measuring apparatus 1. According to formed.

Another object of the present invention is to provide a method of creating a test program creating specification which enables creation of an efficient test program which can be executed at a high speed.

In order to achieve the above objects, according to one aspect of the present invention, there is provided a method of creating a debug specification, which comprises the steps of: reading in one of a measurement specification and a test program; extracting setting conditions for each measuring parameter from the read measurement specification or the test program; extracting terminals of a circuit to be measured that are required for debugging as checking terminals; extracting the setting conditions of the extracted checking terminals as checking conditions; determining whether the checking terminals and the checking conditions for each extracted measuring parameter are changed from the corresponding previous measuring parameter of the previous stage; extracting the changed checking terminals and the checking conditions as changing conditions when the checking terminals and the checking conditions have changed and extracting a changing timing at which the change takes place; and outputting all the changing conditions and the changing timings extracted for all the measuring parameters as a debug specification.

According to another aspect of the present invention, there is provided a method of creating a test program creating specification which comprises the steps of: reading in a measuring specification; extracting setting conditions for each measuring parameter from the read measurement specification; extracting all terminals of a circuit to be measured as checking terminals; extracting the setting conditions of the extracted checking terminals as checking conditions; determining whether the checking terminals and the checking conditions for each extracted measuring parameter are changed from the corresponding previous measuring parameter of the previous stage; extracting the changed checking terminals and the checking conditions as changing conditions when the checking terminals and the checking conditions have changed and extracting a changing timing at which the change takes place; creating a test program specification by adding measuring conditions and standard values to all the changing conditions and the changing timings extracted for all the measuring parameters; and outputting the created test program creating specification.

DESCRIPTION OF THE PREFERRED EMBODIMENTS

Embodiments of the present invention will be described below with reference to the accompanying drawings.

Figure 1:
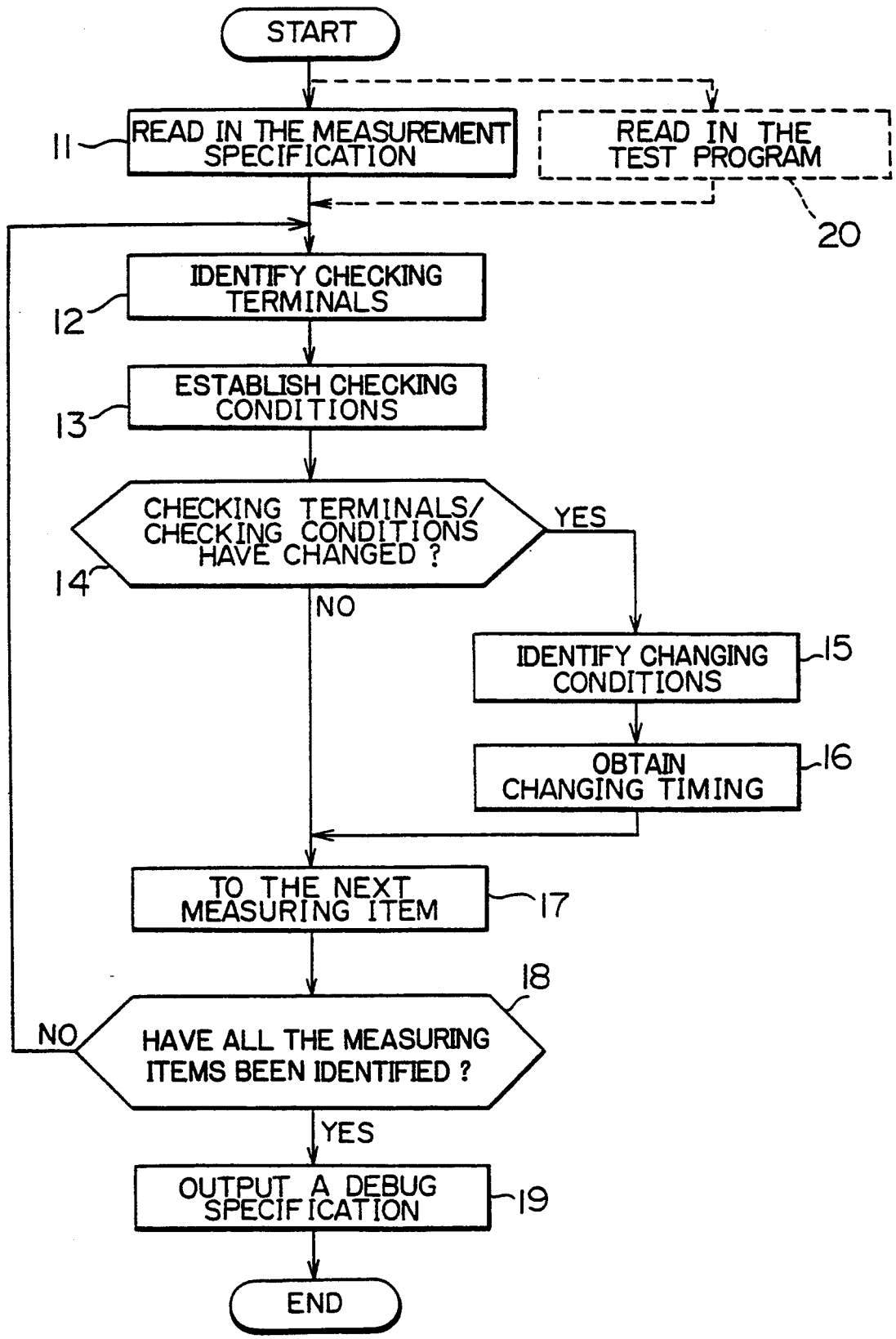
FIG. 1 is a flowchart showing a debug specification creating method according to a first embodiment of the present invention.

Referring first to FIG. 1 which shows a first embodiment of the present invention, the measurement specification shown in Table 1 is first read in a debug specification creating tool of a computer or the like in step 11. Next, the setting conditions are obtained from the measurement specification, and then the terminals required for debugging are identified as checking terminals in step 12. Thereafter, the setting conditions of these checking terminals are established as checking conditions in step 13. Next, it is determined in step S14 whether the checking terminals and the checking conditions in a measuring parameter are changed from those of the previous measuring parameter.

If it is determined in step 14 that the checking terminals and the checking conditions have changed, the process goes to step 15 and the changed checking terminals and the checking conditions are obtained as changed conditions, and then the measuring parameter at which a change took place is obtained as a changed timing in step 16. Thereafter, the process goes to the following measuring parameter in step 17. If it is determined in step 14 that the checking terminals and the checking conditions have not changed, the process goes from step 14 to step 17. The processing from steps 12 to 17 is repeated until it is determined in step 18 that of all the measuring parameters have been established. If it is determined in step 18 that all the measuring parameters have been established, all the changed conditions and the changed timing are listed and output as a debug specification in step 19.

Table 2 shows the debug specification created from the measurement specification shown in Table 1.

TABLE 2

| Debug parameter | | Test parameter | | Checking condition | | | | | | | | |
|---|---|---|---|---|---|---|---|---|---|---|---|---|
| No. | Sequence | No. | Name of parameter | P1 | P2 | P3 | P4 | SW1 | SW2 | SW3 | SW4 | SWa |
| 1 | | 1 | Leak current 1 | M | | OV | | on | | on | | |
| 2 | | 2 | Leak current 2 | open | M | | | off | on | | | |
| 3 | | 3 | Circuit current | | open | | M | | off | | on | on |
| 4 | | 4 | Terminal voltage 1 | M | | | | on | | | | |
| 5 | | 5 | Terminal voltage 2 | open | M | | | off | on | | | |

As can be seen from Table 2, the debug specification created in this embodiment is made up of the data representing the changes in the setting conditions.

In this embodiment, the measurement specification is read in step 11 and then the checking terminals and checking conditions are obtained from the measurement specification. However, a test program may be read in place of the measurement specification in step 20, as shown by the broken line in FIG. 1, so that the checking terminals and checking conditions can be obtained from the test program. In that case, data representing the concrete execution sequence of the test program, e.g., test No. or program execution line No., may be contained in the sequence column under debug parameter in Table 2 so as to create a further detailed debug specification.

Figure 2:
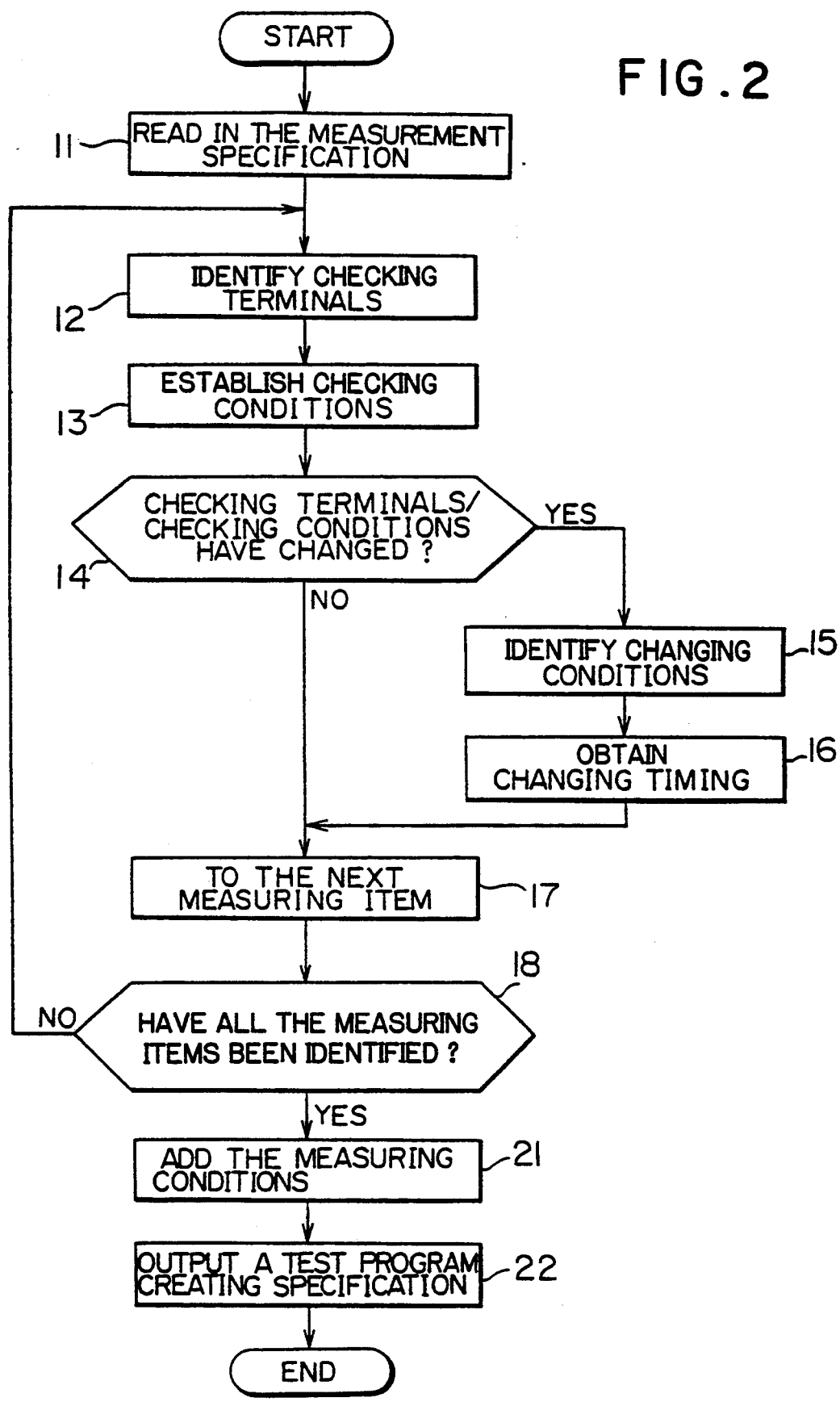
FIG. 2 is a flowchart showing a test program creating specification creating method according to another embodiment of the present invention.
Figure 3:
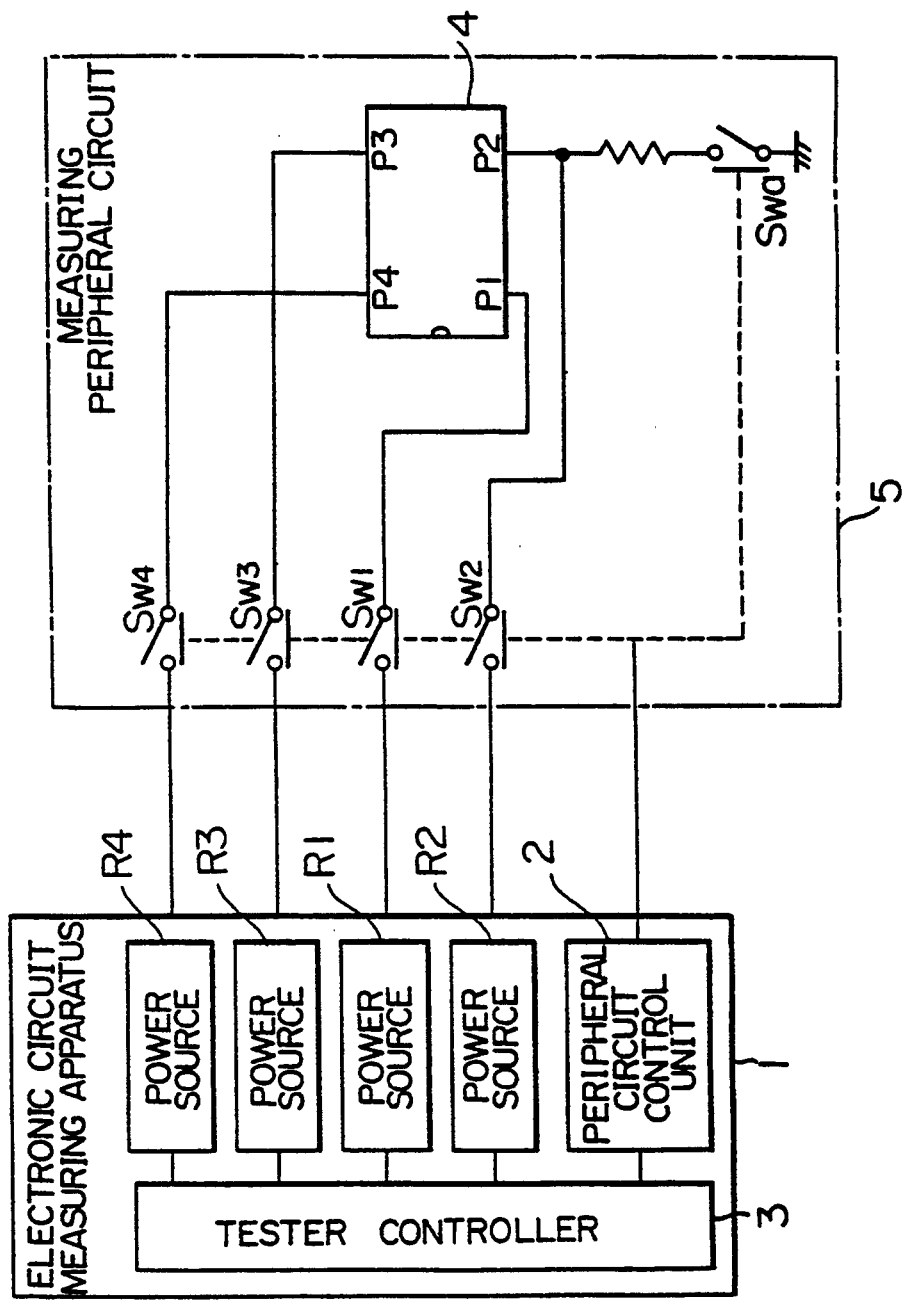
FIG. 3 is a block diagram of a conventional semiconductor measuring apparatus.

In the present invention, it is possible to create the test program creating specification in the similar manner to that of the debug specification. The method of creating the test program creating specification will be described below with reference to FIG. 2. First, changing conditions and changing timing of all the measurement parameters are obtained in steps 11 to 18 in the same manner as in steps 11 to 18 shown in FIG. 1. Next, conditions required for an actual measurement, such as the measuring conditions and the standard values, are added in step 21. Thereafter, in step 22, all the changing conditions, changing timing, measuring conditions and standard values are listed in a table, and are output as the test program creating specification in step 22. Because of the test program creating specification, all the terminals must be identified as checking terminals in step 12.

Table 3 shows the test program creating specification created from the measurement specification shown in Table 1.

TABLE 3

| Measuring parameter | | Measuring condition | Standard value | | Setting condition | | | | | | | | |
|---|---|---|---|---|---|---|---|---|---|---|---|---|---|
| No. | Name of parameter | | Minimum | Maximum | P1 | P2 | P3 | P4 | SW1 | SW2 | SW3 | SW4 | SWa |
| 1 | Leak current 1 | VF = 0.4 V, IM | 1 μA | 3 μA | M | | OV | | on | | on | | |
| 2 | Leak current 2 | VF = 0.4 V, IM | 2 μA | 4 μA | open | M | | | off | on | | | |
| 3 | Circuit current | VF = 5 V, IM | 10 mA | 20 mA | | open | | M | | off | | on | on |
| 4 | Terminal voltage 1 | IF = 0 μA, VM | 1 V | 2 V | M | | | | on | | | | |
| 5 | Terminal voltage 2 | IF = 0 μA, VM | 2 V | 3 V | open | M | | | off | on | | | |

As can be seen from Table 3, the changing conditions and changing timing obtained in steps 11 to 18 are made up of the data representing changes in the setting conditions. It is therefore possible to create an efficient test program which can be executed quickly by using the obtained test program creating specification.

What is claimed is:

1. A method of creating a debug specification comprising:

reading into a computer one but not both of a measurement specification and a test program;

obtaining setting conditions for each of a plurality of measuring parameters from the read measurement specification or test program;

identifying terminals of a circuit to be measured required for debugging as checking terminals;

establishing one of the setting conditions of the plurality of measuring parameters for each of the identified checking terminals as checking conditions;

determining whether the checking terminals and the checking conditions for each of the plurality of measuring parameters have changed from corresponding previously established plurality of measuring parameters;

identifying any changed checking terminals and changed checking conditions as changing conditions and establishing times at which the changed checking conditions take place; and outputting all the changed checking conditions and the changing times at which the changed checking conditions take place for all the measuring parameters as a debug specification.

2. The method according to claim 1 wherein said debug specification is created by tabulating the changed checking conditions and the times at which the changed checking conditions take place.

3. A method of creating a test program creating specification comprising:

reading into a computer a measuring specification;

obtaining setting conditions for each of a plurality of measuring parameters from the read measuring specification;

identifying all terminals of a circuit to be measured as checking terminals;

establishing one of the setting conditions of the plurality of measuring parameters for each of the identified checking terminals as checking conditions;

determining whether the identified checking terminals and the checking conditions for each of the plurality of measuring parameters have changed from corresponding previously established plurality of measuring parameters;

identifying any changed checking terminals and changed checking conditions as changing conditions and establishing times at which the changed checking conditions take place;

creating a test program creating specification by adding measuring conditions and standard values to all the changed checking conditions and the times at which the changed checking conditions take place for all the plurality of measuring parameters; and outputting the created test program creating specification.

4. The method according to claim 3 wherein said test program creating specification is created by tabulating the changed checking conditions and the times at which the changed checking conditions take place and the added measuring conditions and the standard values.

* * * * *